United States Patent
Engelmann et al.

(10) Patent No.: US 7,045,917 B2
(45) Date of Patent: May 16, 2006

(54) CIRCUIT ARRANGEMENT FOR AN ELECTRIC APPLIANCE

(75) Inventors: Harry Engelmann, Ingelheim (DE); Kurt Schaupert, Hofheim (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/801,097

(22) Filed: Mar. 15, 2004

(65) Prior Publication Data
US 2004/0222824 A1    Nov. 11, 2004

(30) Foreign Application Priority Data
Mar. 15, 2003   (DE)   ............... 103 11 447

(51) Int. Cl.
*H02B 1/24*   (2006.01)
(52) U.S. Cl. ............ 307/128; 307/154; 315/291
(58) Field of Classification Search ........ 363/67, 363/85, 21.1; 307/139–141.4
See application file for complete search history.

(56) References Cited

U.S. PATENT DOCUMENTS 4,626,698 A * 12/1986 Harnden et al. ............ 307/38
4,658,155 A *  4/1987 Ohba et al. ................ 307/154

FOREIGN PATENT DOCUMENTS

| DE | 199 23 148 A1 | 11/1999 |
| DE | 199 44 235 A1 | 3/2001 |
| DE | 199 32 453 C2 | 10/2001 |

* cited by examiner

*Primary Examiner*—Rajnikant B. Patel
(74) *Attorney, Agent, or Firm*—Pauley Petersen & Erickson

(57) ABSTRACT

A circuit arrangement for an electric appliance, having a control device and a power supply unit connected with an electric current supply connector for providing functional units, which are to be controlled, of the electric appliance with current. A switch is provided on the electric current supply connector for cutting off the power supply unit from the electric current supply connector on a primary side. The switch has a piezo switch which is open in the non-activated state. The circuit arrangement of this invention is used, for example, in connection with electronic household appliances.

17 Claims, 1 Drawing Sheet

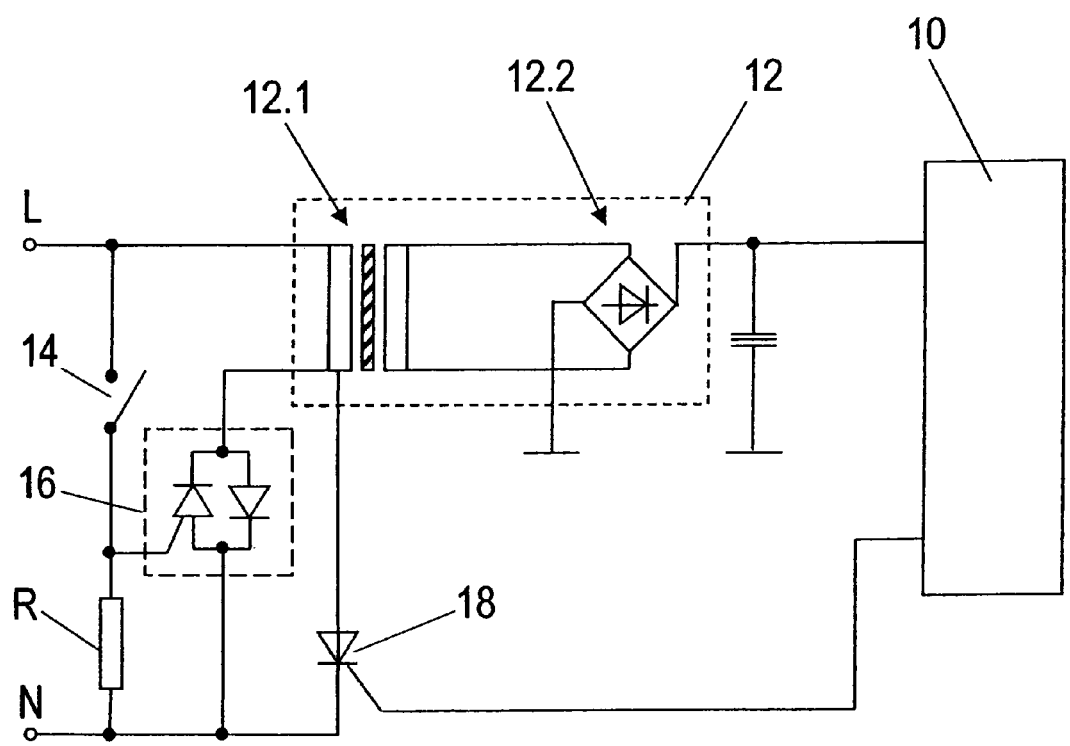

CIRCUIT ARRANGEMENT FOR AN ELECTRIC APPLIANCE

BACKGROUND OF THE INVENTION

1. Field of the Invention

This invention relates to a circuit arrangement for an electric appliance, having a control device and a power supply unit connected with an electric current supply connector for providing functional units, which are to be controlled, of the electric appliance with current, wherein there is a switch on the electric current supply connector for cutting off the power supply unit from the electric current supply connector on a primary side.

2. Discussion of Related Art

It is known to equip electric appliances used, for example in the household, with electronic controls. Electronic touch controls are employed in particular for stove top cooking units, stoves, dishwashers, washing machines and similar household appliances. One disadvantage is that the touch controls must be maintained ready, to be able to react to inputs. In the process, known appliances use a so-called quiescent current that is determined by the power use of the implemented electronic circuits and the losses of the power transformer. Typically, the power consumption is about 1 W. Although such a power consumption is relatively low, overall it can result in a considerable quiescent current consumption in connection with a large number of conventional devices.

It is also known from the prior art to produce electronic controls without quiescent current consumption. Here a central mechanical switch can be provided. However, it is disadvantageous for the operating concept of touchless switches to be disrupted. For changing the state between ON and OFF, the mechanical switch requires a path for the toggle switch. Thus the operating surface must have an opening that increases production costs for such an operating surface, cleaning is more difficult, and it is necessary to accept limitations in the design.

A stove top cooking surface is known from German Patent Reference DE 199 23 148 A1, wherein the energy supply can be switched on via a Reed contact. However, the use of a Reed contact is disadvantageous because a magnet is required for activation, which is easily lost under certain circumstances.

German Patent Reference DE 199 44 235 A1 discloses shutting off the energy supply of a stove top cooking surface as taught by German Patent Reference DE 199 23 148 A1 by a Reed contact. Thus the magnet is only required to place the electric appliance into a rest state without using quiescent current. If the magnet is lost, the electric appliance continues to use energy in the rest state.

German Patent Reference DE 199 32 453 C2 discloses making a household appliance available in the rest state without quiescent current use. Here, the power supply unit of the household appliance is switched on by a thyristor, which is switched on by an optical coupler via a data network outside of the appliance. It is thus possible to locally switch off the household appliance so that no quiescent current is used, and to switch it back on again via a central control device. Thus no energy is used during the night or during vacation time. However, the consumption in the still remaining stand-by time is disadvantageous, because the energy consumption of the central control device is used during the entire day.

SUMMARY OF THE INVENTION

It is one object of this invention to provide a circuit arrangement for an electric appliance which simply permits the placement of the electric appliance into service out of a rest state without the consumption of quiescent current and to place it into a rest state without consumption of quiescent current when it is switched off. The circuit arrangement in accordance with this invention is also intended to make it possible to avoid use of mechanical switches, which require an opening in the operating surface, and thus to minimize the production costs of the operating surface and to make it easy to clean.

The above and other objects of this invention are attained by characteristics discussed in this specification and in the claims.

Accordingly, the switch has a piezo switch for cutting off the power supply unit from the electric power supply connector on the primary side, which is open in the non-activated state.

Such a piezo switch can be attached underneath and activated through closed metal and glass surfaces or similar surfaces. A short operating distance is sufficient for activating a piezo switch, and this is assured by those surfaces as are generally used for covers for operating panels.

In accordance with one embodiment, the piezo switch is connected with a power semiconductor circuit which, when the piezo switch is operated, connects the control device for its activation with the electric power supply connector. Thus the control device at least briefly receives the current required for the activation of further functions.

When actuating the piezo switch, it is possible to briefly generate a voltage for activating the power semiconductor circuit because of the actuating force applied by the operator. This voltage can be used by the power semiconductor circuit thus activated for connecting the control device with the electric power supply connector via the power supply unit.

In accordance with one embodiment, the power semiconductor circuit has at least one triac, triode alternating current switch. The voltage briefly generated by the piezo switch is sufficient for activating such a triac.

To maintain the current supply for the electric appliance during its operation, the control device can be connected with a lock-in circuit, which can be activated by the control device. The current supply is thus maintained.

In accordance with one embodiment, the lock-in circuit has at least one thyristor. Alternatively, the lock-in circuit can also have at least one electro-mechanical relay or a Reed relay.

In order to cut off the control device from the electric power supply connector when the electric appliance is switched off, the control device is connected with an appropriate semiconductor circuit. In this case the control device can deactivate the lock-in circuit for cutting off the electric power supply connector and for switching off the electric appliance.

BRIEF DESCRIPTION OF THE DRAWINGS

This invention is described in greater detail in view of one embodiment shown in one schematic circuit diagram of a circuit arrangement such as employed in a household appliance, for example.

DESCRIPTION OF PREFERRED EMBODIMENTS

The circuit arrangement has an electric power supply connector with two individual connectors L and N. A series circuit including a piezo switch 14 and a resistor R is provided on the circuit side between the electric power supply connectors L and N.

On a primary side the voltage supply connector L is connected with a connector of a transformer 12.1. The second connector on the primary side of the transformer 12.1 is switched together via a triac 16 with the electric power supply connector N and via a thyristor 18 with the electric power supply connector N. A control connection of the triac 16 is switched between the piezo switch 14 and the resistor R. The control connection of the thyristor 18 is connected with a control device 10. The two connections of the transformer 12.1 on the secondary side are switched together with a rectifier bridge 12.2, having an output side connected with the control device 10. Together, the transformer 12.1 and the rectifier bridge 12.2 form the power supply unit 12.

The electronic control device 10 is activated via the piezo switch 14. The piezo switch 14 takes energy from the actuating force exerted by the operator and triggers the triac 16 with it, which in turn switches on the power supply unit 12.

An arrangement including a ceramic piezo element can be used as the piezo switch 14, which triggers two MOSFET transistors so that upon actuation the resistance of the switch drops from approximately 5 MOhm to 10 Ohm. In this case the actuating force is approximately 1 N through an aluminum layer of a thickness of 0.6 mm. However, thicker operating panels are customarily used, so that the actuating force here is between 3 and 5 N.

The piezo switch 14 is actuated for switching on the electric appliance. The piezo switch 14 switches on the triac 16, which briefly supplies the control device 10 with current via the power supply unit 12. With this brief current supply, the control device 10 switches the thyristor 18 on, so that the power supply is maintained. Thus, the thyristor 18 is a part of a lock-in circuit.

If the electric appliance is to be switched off, the control circuit 10 cancels the signal at the thyristor 18, so that the power supply is practically completely switched off. Alternatively, an electromechanical relay or a Reed relay can be used in place of the thyristor 18.

In one embodiment the piezo switch 14 can also be used for voltage generation and make available the energy required for switching on the triac 16. Such piezo switches are known and are used for the brief voltage supply for wireless transmitting switches, offered for example by the ENOcean company.

With this circuit arrangement in accordance with this invention it is possible without the use of a mechanical switch to place an electric appliance into a rest state in which no quiescent current flows.

German Patent Reference 103 11 447.5, the priority document corresponding to this invention, and its teachings are incorporated, by reference, into this specification.

What is claimed is:

1. A circuit arrangement for an electric appliance, having a control device (10) and a power supply unit (12) connected with an electric current supply connector (L, N) for providing controlled functional units of the electric appliance with current, wherein a switch (14) on the electric current supply connector (L, N) can cut off the power supply unit (12) from the electric current supply connector (L, N) on a primary side, the circuit arrangement comprising:

the switch (14) having a piezo switch which is open in a non-activated state.

2. The circuit arrangement in accordance with claim 1, wherein the piezo switch (14) is connected with a power semiconductor circuit (16) which, when the piezo switch (14) is operated, connects the control device (10) for activation with the electric power supply connector (L, N).

3. The circuit arrangement in accordance with claim 2, wherein when the piezo switch (14) is actuated, a brief voltage for activating the power semiconductor circuit (16) is generated at the piezo switch (14) due to actuating force exerted on the piezo switch (14).

4. The circuit arrangement in accordance with claim 3, wherein the power semiconductor circuit (16) has at least one of a triac and a triode alternating current switch.

5. The circuit arrangement in accordance with claim 4, wherein the activated power semiconductor circuit (16) connects the control device (10) with the electric power supply connector (L, N) via the power supply unit (12).

6. The circuit arrangement in accordance with claim 5, wherein for maintaining the current supply for the electric appliance during operation, the control device (10) is connected with a lock-in circuit (18) that can be activated by the control device (10).

7. The circuit arrangement in accordance with claim 4, wherein the lock-in circuit has at least one thyristor.

8. The circuit arrangement in accordance with claim 5, wherein the lock-in circuit has at least one of an electromechanical relay and a Reed relay.

9. The circuit arrangement in accordance with claim 8, wherein the control device (10) is connected with a semiconductor circuit for cutting off the control device (10) from the electric power supply connector (L, N).

10. The circuit arrangement in accordance with claim 9, wherein the control device (10) deactivates the lock-in circuit (18) for cutting off the electric power supply connector (L, N) and for switching off the electric appliance.

11. A circuit arrangement for an electric appliance, having a control device (10) and a power supply unit (12) connected with an electric current supply connector (L, N) for providing controlled functional units of the electric appliance with current, wherein a switch (14) on the electric current supply connector (L, N) can cut off the power supply unit (12) from the electric current supply connector (L, N) on a primary side, the circuit arrangement comprising:

the switch (14) including a piezo switch which is open in a non-activated state, wherein the piezo switch (14) is connected with a power semiconductor circuit (16) which, when the piezo switch (14) is operated, connects the control device (10) for activation with the electric power supply connector (L, N), wherein the power semiconductor circuit (16) has at least one of a triac and a triode alternating current switch.

12. The circuit arrangement in accordance with claim 3, wherein the activated power semiconductor circuit (16) connects the control device (10) with the electric power supply connector (L, N) via the power supply unit (12).

13. The circuit arrangement in accordance with claim 1, wherein for maintaining the current supply for the electric appliance during operation, the control device (10) is connected with a lock-in circuit (18) that can be activated by the control device (10).

14. A circuit arrangement for an electric appliance, having a control device (10) and a power supply unit (12) connected with an electric current supply connector (L, N) for providing controlled functional units of the electric appliance with current, wherein a switch (14) on the electric current supply connector (L, N) can cut off the power supply unit (12) from the electric current supply connector (L, N) on a primary side, the circuit arrangement comprising:

the switch (14) having a piezo switch which is open in a non-activated state, and, for maintaining the current supply for the electric appliance during operation, the control device (10) is connected with a lock-in circuit (18) that can be activated by the control device (10), the lock-in circuit including at least one thyristor.

15. The circuit arrangement in accordance with claim 4, wherein the lock-in circuit has at least one of an electromechanical relay and a Reed relay.

16. The circuit arrangement in accordance with claim 1, wherein the control device (10) is connected with a semiconductor circuit for cutting off the control device (10) from the electric power supply connector (L, N).

17. The circuit arrangement in accordance with claim 2, wherein the control device (10) deactivates the lock-in circuit (18) for cutting off the electric power supply connector (L, N) and for switching off the electric appliance.

\* \* \* \* \*